United States Patent
Kato

(10) Patent No.: US 9,786,871 B2
(45) Date of Patent: Oct. 10, 2017

(54) METHOD OF MANUFACTURING A DISPLAY DEVICE

(71) Applicant: Japan Display Inc., Minato-ku (JP)

(72) Inventor: Daisuke Kato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/391,221

(22) Filed: Dec. 27, 2016

(65) Prior Publication Data

US 2017/0250380 A1    Aug. 31, 2017

(30) Foreign Application Priority Data

Feb. 25, 2016 (JP) ................... 2016-034566

(51) Int. Cl.
*H01L 51/52* (2006.01)
*H01L 51/56* (2006.01)

(52) U.S. Cl.
CPC .......... *H01L 51/56* (2013.01); *H01L 51/5203* (2013.01); *H01L 51/5246* (2013.01); *H01L 51/5253* (2013.01); *H01L 51/5259* (2013.01)

(58) Field of Classification Search
CPC . H01L 51/56; H01L 51/5203; H01L 51/5253; H01L 51/5259; H01L 51/5246; H01L 51/5237; H01L 51/524
See application file for complete search history.

(56) References Cited

U.S. PATENT DOCUMENTS

| | | | | |
|---|---|---|---|---|
| 9,105,876 B2 * | 8/2015 | Choi | .................. | H01L 51/0005 |
| 9,166,194 B2 * | 10/2015 | Kato | .................. | H01L 51/5253 |
| 2014/0225089 A1 | 8/2014 | Kato et al. | | |
| 2015/0008406 A1 * | 1/2015 | Furuie | ................. | H01L 51/5246 |
| | | | | 257/40 |
| 2015/0060817 A1 * | 3/2015 | Sato | ....................... | H01L 27/323 |
| | | | | 257/40 |
| 2015/0155523 A1 | 6/2015 | Kamiya | | |
| 2015/0214504 A1 * | 7/2015 | Sonoda | ............... | H01L 51/5256 |
| | | | | 257/40 |
| 2015/0340654 A1 | 11/2015 | Kato et al. | | |
| 2016/0285040 A1 | 9/2016 | Kamiya | | |
| 2016/0293685 A1 | 10/2016 | Kato et al. | | |
| 2016/0293890 A1 | 10/2016 | Kato et al. | | |
| 2016/0301033 A1 | 10/2016 | Kato et al. | | |

FOREIGN PATENT DOCUMENTS

| | | |
|---|---|---|
| JP | 2007-250370 | 9/2007 |
| JP | 2014-154450 | 8/2014 |
| JP | 2015-109192 | 6/2015 |

* cited by examiner

*Primary Examiner* — Michael Trinh
(74) *Attorney, Agent, or Firm* — Oblon, McClelland, Maier & Neustadt, L.L.P.

(57) ABSTRACT

A light-emitting element layer and an element layer, which includes an anode and a cathode that sandwich the light-emitting element layer, are formed, and a sealing film is formed so as to cover the entire element layer. In the step of forming the sealing film, a first inorganic film is formed on the element layer. An organic film is formed on the first inorganic film. The organic film is ashed by using a foreign substance remaining on the organic film as a mask such that the organic film is left at least immediately below the mask and removed from at least a part of other areas. After the organic film is ashed, a second inorganic film is formed at least on the first inorganic film.

6 Claims, 6 Drawing Sheets

METHOD OF MANUFACTURING A DISPLAY DEVICE

CROSS-REFERENCE TO RELATED APPLICATION

The present application claims priority from Japanese application JP2016-034566 filed on Feb. 25, 2016, the content of which is hereby incorporated by reference into this application.

BACKGROUND OF THE INVENTION

1. Field of the Invention

The present invention related to a method for manufacturing a display device.

2. Description of the Related Art

Light-emitting element layers, such as an organic electroluminescence layer, can be deteriorated due to moisture absorption, and thus need to be covered by a sealing film to block the air. For example, a structure has been known in which a sealing film of a multilayer structure that sandwiches an organic film made of resin between inorganic films is used for sealing a light-emitting element layer. In such a structure, an organic film fills an unevenness generated by a foreign substance, and thus it is possible to prevent defects caused by an inorganic film and obtain high barrier performance (JP2007-250370A and JP2014-154450A).

As disclosed in JP2015-109192A, an insulating layer (bank) that partitions pixels generates an unevenness, and thus a sealing film is formed on the unevenness and a surface of a lower inorganic film also has an unevenness. Materials for forming an organic film easily fall from a projection into a recess and stay there, which causes both an area with an organic film and an area without an organic film to be formed between upper and lower inorganic films. This causes multiple reflections in the sealing film due to differences of refractive index, and thus greatly affects optical properties. Further, uniformity in thickness or shape of organic films would lead to uneven optical properties. In addition, compared to adhesion between inorganic films, adhesion between an organic film and an inorganic film is low, and they are easily delaminated.

SUMMARY OF THE INVENTION

One or more embodiments of the present invention have been conceived in view of the above, and an object thereof is to enhance abrasion durability of a sealing film and stabilize optical properties.

A method for manufacturing a display device according to the present invention includes the steps of forming a light-emitting element layer and an element layer including an anode and a cathode that sandwich the light-emitting element layer, and forming a sealing film so as to cover the entire element layer. The step of forming the sealing film includes the steps of forming a first inorganic film on the element layer, forming an organic film on the first inorganic film, ashing the organic film by using a foreign substance remaining on the organic film as a mask such that the organic film is left at least immediately below the mask and removed from at least a part of other areas, and forming a second inorganic film at least on the first inorganic film after ashing the organic film. According to the present invention, even if there is a foreign substance, an organic film is left to fill and smooth an unevenness generated by the foreign substance, and thus it is possible to obtain high barrier performance. Further, an organic film is asked to be removed from at least one part of other areas, and thus it is possible to enhance abrasion durability and stabilize optical properties.

DETAILED DESCRIPTION OF THE INVENTION

An embodiment of the present invention will be described below in detail with reference to the accompanying drawings.

Figure 1:
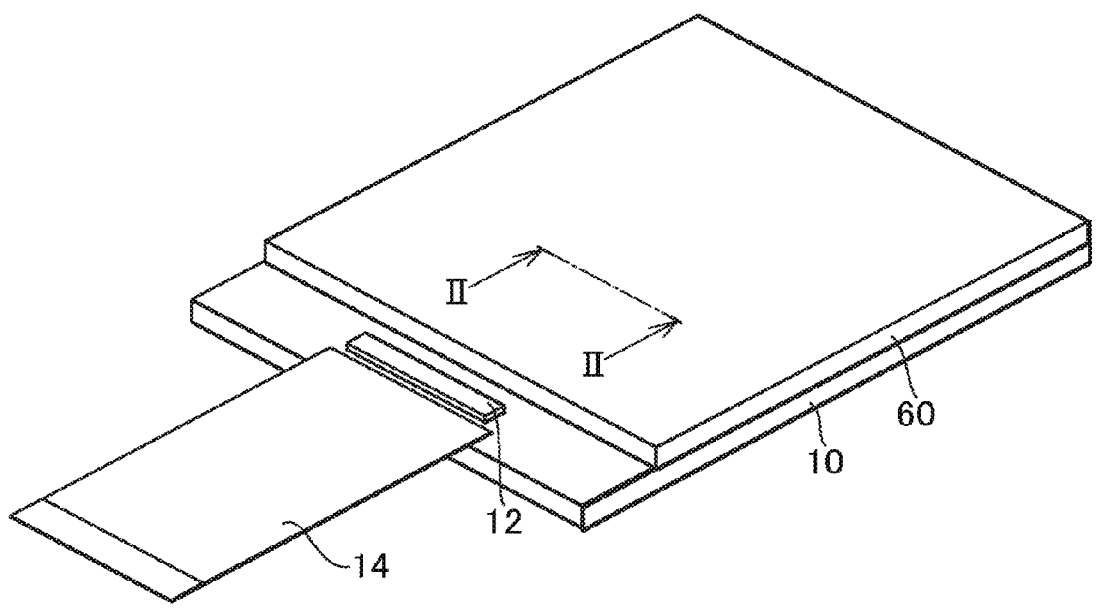
FIG. 1 is a perspective view of a display device according to an embodiment of the present invention.

FIG. 1 is a perspective view of a display device according to an embodiment of the present invention. An organic electroluminescence display device is taken as an example of a display device. The display device combines unit pixels (sub-pixels) of multiple colors, such as red, green, and blue, to form full-color pixels, and displays a full-color image. The display device includes a first substrate 10 made of resin. The first substrate 10 includes an integrated circuit chip 12 for driving an element that displays an image, and is connected to a flexible printed board 14 for external electrical connections.

Figure 2:
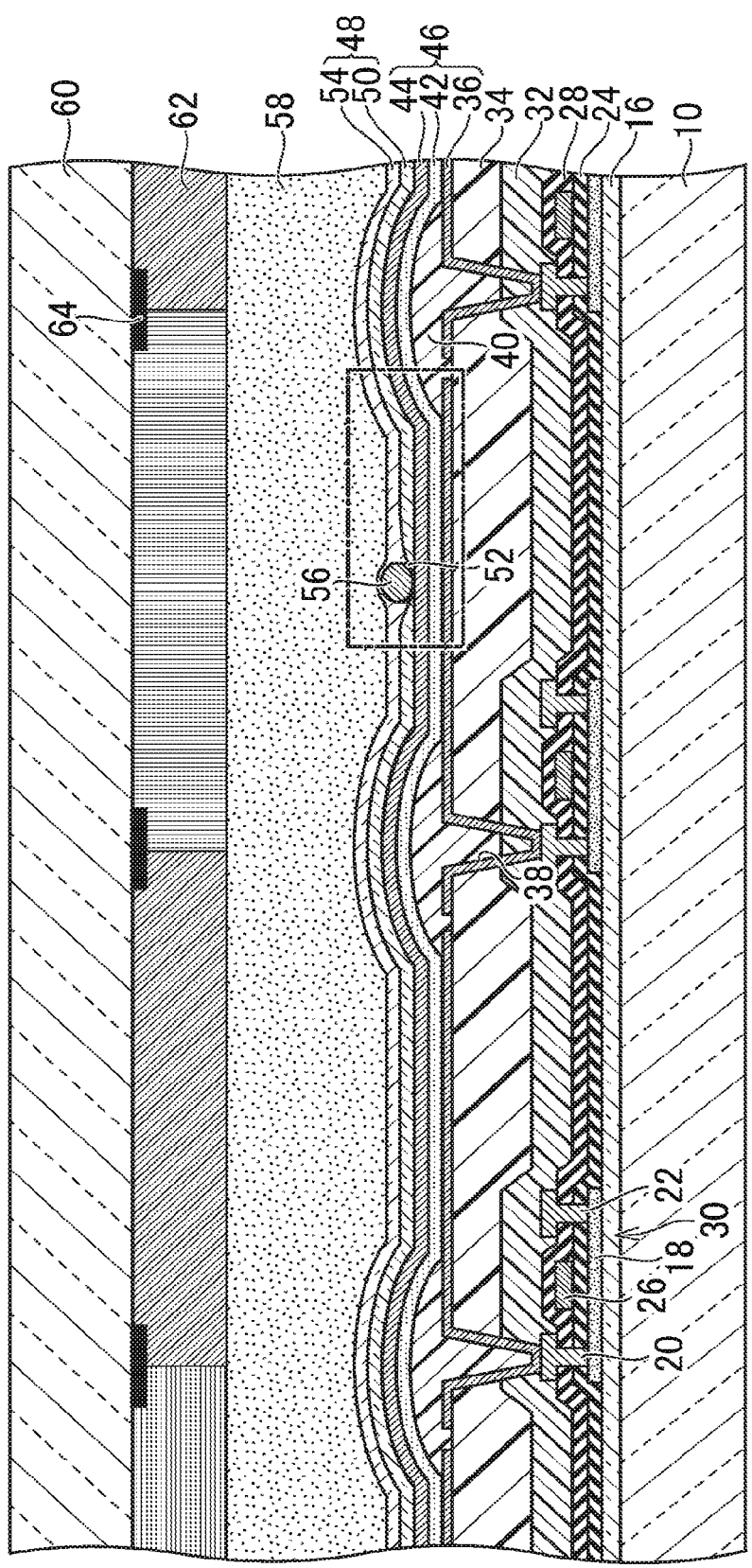
FIG. 2 is a cross-sectional view of the display device shown in FIG. 1 taken along the line II-II.

FIG. 2 is a cross-sectional view of the display device shown in FIG. 1 taken along the line II-II. On the first substrate 10, an undercoat 16 is formed so as to serve as a barrier to impurities included in the first substrate 10, and a semiconductor layer 18 is formed on the undercoat 16. A source electrode 20 and a drain electrode 22 are provided on the semiconductor layer 18, and a gate insulating film 24 is formed to cover the semiconductor layer 18. A gate electrode 26 is formed on the gate insulating film 24, and an insulating interlayer 28 is formed to cover a gate electrode 26. The source electrode 20 and the drain electrode 22 pass through the gate insulating film 24 and the insulating interlayer 28. A thin film transistor 30 is composed of the semiconductor layer 18, the source electrode 20, the drain electrode 22, and the gate electrode 26. A passivation film 32 is provided to cover the thin film transistor 30.

A flattening layer 34 is provided on the passivation film 32. A plurality of pixel electrodes 36 (e.g., anodes), which are configured to respectively correspond to unit pixels, are provided on the flattening layer 34. The flattening layer 34 is formed in such a way that at least a surface on which the pixel electrodes 36 are provided is flat. The pixel electrodes 36 are electrically connected to one of the source electrode 20 and the drain electrode 22 on the semiconductor layer 18 via a contact hole 38 passing through the flattening layer 34 and the passivation film 32.

An insulating layer 40 is formed on the flattening layer 34 and the pixel electrodes 36. The insulating layer 40 is disposed on a perimeter of a pixel electrode 36, and formed so as to make an opening on a part (e.g., the center) of the pixel electrode 36. The insulating layer 40 forms a bank that surrounds a part of the pixel electrode 36. In other words, the insulating layer 40 protrudes toward the surface of the pixel electrode 36.

The light-emitting element layer 42 is provided on the pixel electrode 36. The light-emitting element layer 42 is continuously disposed over the plurality of pixel electrodes 36, and also disposed on the insulating layer 40. As a variation, a light emitting element layer 42 may be provided to each (separated) pixel electrode 36. In this case, a light-emitting element layer 40 emits light in blue, red, or green according to each pixel, and thus a colored layer 62 and a black matrix 64, each described later, need not to be provided. The light-emitting element layer 42 includes at least a light emitting layer, and may further include at least one of an electron transport layer, a hole transport layer, an electron injection layer, and a hole injection layer.

A common electrode 44 (e.g., cathode) is provided on the light emitting element layer 42 such that the common electrode 44 is in contact with the light emitting element layer 42 on the plurality of pixel electrodes 36. The common electrode 44 is formed so as to be disposed on the insulating layer 40, which is a bank. The light emitting element layer 42 is disposed between the pixel electrode 36 and the common electrode 44 to be controlled in brightness by an electric current that flows between them, and emits light. A element layer 46 includes the light-emitting element layer 42, the pixel electrode 36 (anode), and the common electrode 44 (cathode), where the light-emitting element layer 42 is disposed between the pixel electrode 36 and the common electrode 44.

Figure 3:
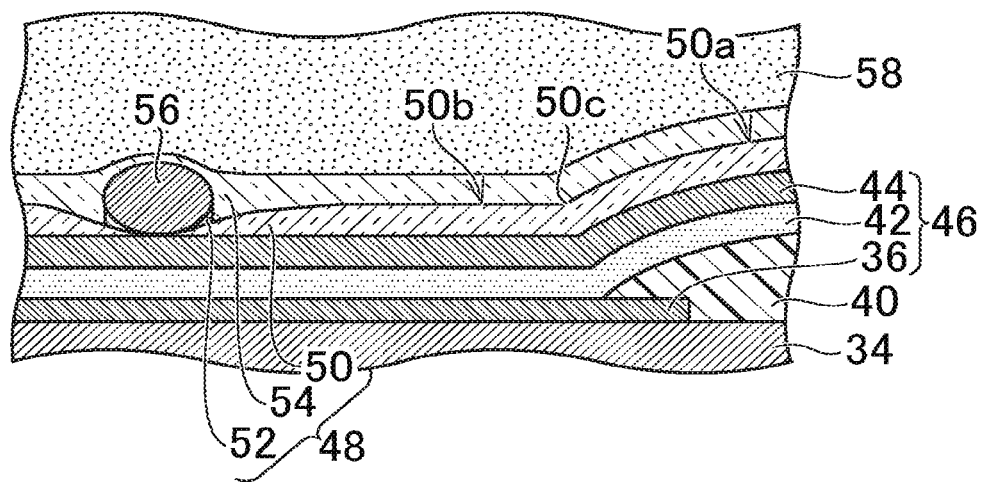
FIG. 3 is a diagram enlarging a region surrounded by a dashed line of FIG. 2.

FIG. 3 is a diagram enlarging a region surrounded by a dashed line of FIG. 2. The element layer 46 has an uneven upper surface. The unevenness on the element layer 46 is formed by the insulating layer 40 and the surface of the pixel electrode 36 exposed from the insulating layer 40. The surface of the element layer 46 is flat over the exposed surface of the pixel electrode 36 from the insulating layer 40. The surface of the element layer 46 is raised over the insulating layer 40.

The light-emitting element layer 42 is covered by the sealing film 48 stacked on the common electrode 44, and thus sealed and protected from moisture. The sealing film 48 includes a first inorganic film 50 formed on the element layer 46. The first inorganic film 50 has a projection 50*a* on the raised part of the element layer 46. The first inorganic film 50 has a flat part 50*b* on the flat part of the element layer 46. The boundary between the projection 50*a* and the flat part 50*b* is a recess 50*c*. The sealing film 48 includes an organic film 52 formed on the first inorganic film 50. The organic film 52 is provided in a way to avoid the recess 50*c* of the first inorganic film 50, that is, the vicinity of the boundary between the projection 50*a* and the flat part 50*b*. As such, the organic film 52 is not bent in the thickness direction, and thus is hard to be delaminated. The sealing film 48 includes a second inorganic film 54 formed on the organic film 52.

In this embodiment, a foreign substance 56, which is generated by an unetched part, for example, is located under the sealing film 48. The foreign substance 56 is located on the common electrode 44. The first inorganic film 50 lies under the foreign substance 56 so as to surround the contact part of the foreign substance 56 and the common electrode 44. The foreign substance 56 and the first inorganic film 50 are separated by the organic film 52. Specifically, the organic film 52 matches to or is in a range of a shadow that is generated when the foreign substance 56 is projected on the first inorganic film 50. As such, the organic film 52 is provided only in an area where light transmission is blocked by the foreign substance 56, thereby giving less effect to optical properties. The second inorganic film 54 covers the foreign substance 56 and the organic film 52, and is disposed on the first inorganic film 50. The second inorganic film 54 is thin on the foreign substance 56, and thick around the foreign substance 56.

As shown in FIG. 2, a second substrate 60 is provided over the sealing film 48 via a filler layer 58. The second substrate 60 is provided with colored layers 62 in plural colors (e.g., blue, red, green), and a black matrix 64 made of metal or resin is formed between adjacent colored layers 62 in different colors, which forms a color filter. The second substrate 60 may be a touch panel or include a polarizing plate or a retardation plate.

FIGS. 4A to 4D are diagrams for explaining a method for manufacturing the display device according to the embodiment of the present invention.

Figure 4A:
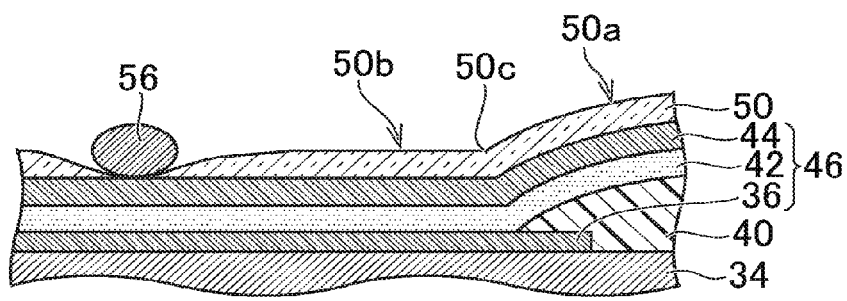
FIGS. 4A to 4D are diagrams for explaining a method for manufacturing the display device according to an embodiment of the present invention.

As shown in FIG. 4A, an element layer 46 is formed including the light-emitting element layer 42, the pixel electrode 36 (anode), and the common electrode 44 (cathode). The light-emitting element layer 42 is disposed between the pixel electrode 36 and the common electrode 44. A known process may be applied to this process. The insulating layer 40 is disposed on respective perimeters of the pixel electrodes 36. The unevenness on the surface of the element layer 46 is formed by the insulating layer 40 and the exposed surfaces of the pixel electrodes 36 from the insulating layer 40. In the above process, the foreign substance 56 may remain because forming and etching layers are performed. For example, the foreign substance 56 is placed on the common electrode 44.

A first inorganic film 50 is formed on the element layer 46 so as to protect the element layer 46 from moisture. The first inorganic film 50 is formed in a way to include a projection 50*a* in accordance with the uneven shape of the element layer 46. The first inorganic film 50 has a flat part 50*b* on the flat part of the element layer 46. The boundary between the projection 50*a* and the flat part 50*b* is a recess 50*c*. The first inorganic film 50 is made of SiN and formed by, for example, a plasma-enhanced chemical vapor deposition (PECVD) method. A SiN film is formed by generating plasma in mixed gas of SiH4, NH3, and N2. Alternatively, the first inorganic film 50 may be formed by any suitable process including conventional vacuum processes such as sputtering, evaporation, sublimation, chemical vapor deposition (CVD), electron cyclotron resonance plasma-enhanced chemical vapor deposition (ECR-PECVD), and combinations thereof. With these processes, the first inorganic film 50 is also formed to enter below the foreign substance 56.

Figure 4B:
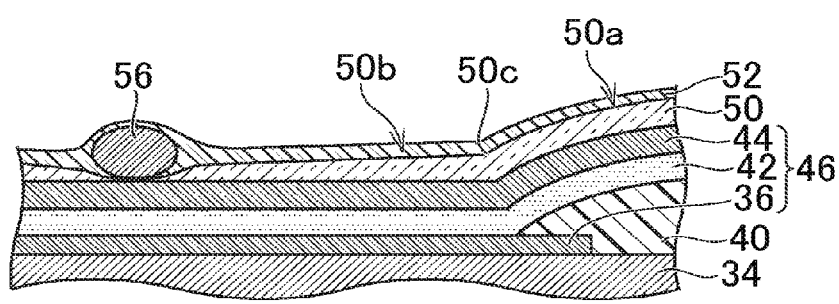

As shown in FIG. 4B, an organic film 52 made of acrylic resin, for example, is formed on the first inorganic film 50. The organic film 52 is formed by vapor deposition. The organic film 52 is formed over the foreign substance 56. The vapor deposition has the property of making a deposition material easily attach to an area in which a surface is changed to an uneven shape. As such, the organic film 52 easily attaches to a hollow formed around the foreign substance 56, and thus enters below the foreign substance 56, thereby making a part around the foreign substance 56 thicker than other parts. The organic film 52 is thinner than other parts around the projection 50a on the first inorganic film 50.

Figure 4C:
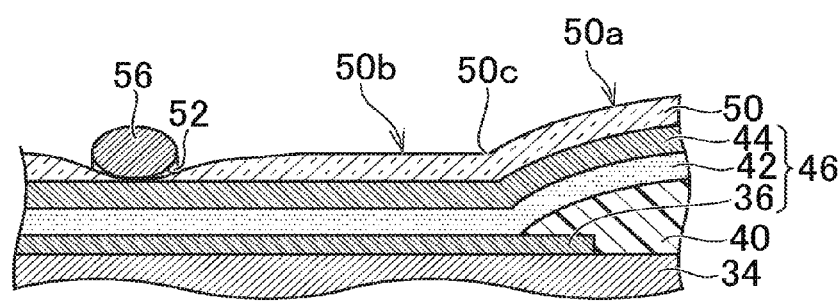

As shown in FIG. 4C, the organic film 52 is ashed. The organic film 52 lies under the foreign substance 56, and thus the foreign substance 56 serves as a mask for ashing. Using the foreign substance 56 as a mask, the organic film 52 remains at least immediately below the mask, and is removed from at least a part of other areas (e.g., whole part).

Figure 4D:
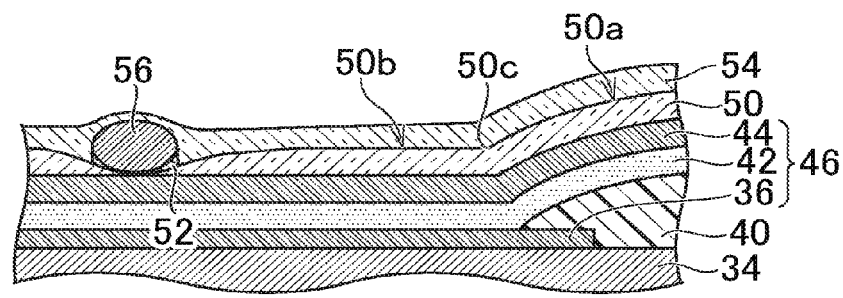

As shown in FIG. 4D, after the organic film 52 is ashed, a second inorganic film 54 is formed at least on the first inorganic film 50. The second inorganic film 54 may be made of SiN using the same technique for forming the first inorganic film 50. In this way, the sealing film 48 is formed so as to cover the entire element layer 46. The sealing film 48 has the organic film 52 between the first inorganic film 50 and the second inorganic film 54. The organic film 52 fills the hollow formed around the foreign substance 56, and thus a hole is not formed in the second inorganic film 54 and high barrier performance can be provided. Further, even if the organic film 52 is thickly formed in the recess 50c of the first inorganic film 50, the organic film 52 is removed later by ashing, and thus the organic film 52 does not have a part that is thick enough to affect the optical properties.

Figure 5:
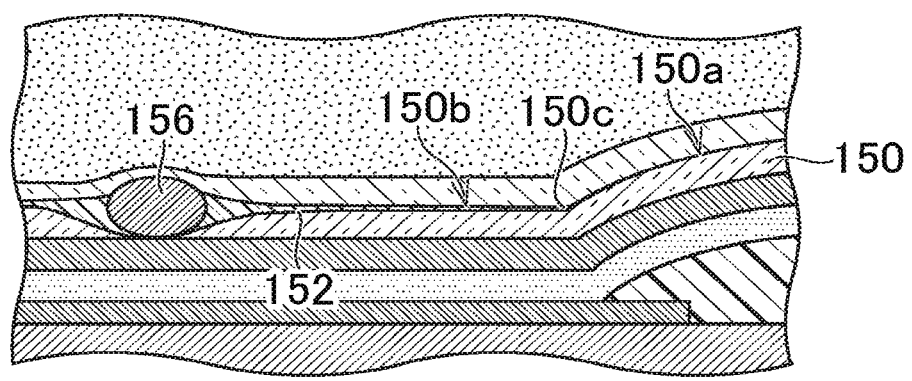
FIG. 5 is a diagram for explaining variation 1 of the method for manufacturing the display device according to an embodiment of the present invention.

FIG. 5 is a diagram for explaining variation 1 of the method for manufacturing the display device according to the embodiment of the present invention. This example is different from the above described embodiment (see FIG. 4C) in that the organic film 152 is removed from a surface of a projection 150a of a first inorganic film 150, and left around a projection 150a (an area from a flat part 150b to a recess 150c) of the first inorganic film 150 in the process to ash the organic film 152. That is, the organic film 152 protrudes from an area immediately below a foreign substance 156. In this regard, the remaining organic film 152 is thin due to asking. The organic film 152 remains on the flat part 150b of the first inorganic film 150, and reaches to a projection 150a so that a height of the upper surface is not high. As such, the organic film 152 does not have a part that is thick enough to affect the optical properties. Further, the organic film 152 is not bent in the thickness direction in accordance with the projection 150a of the first inorganic film 150, and thus is less likely to be delaminated. Other processes are the same as the processes described in the embodiment.

Figure 6:
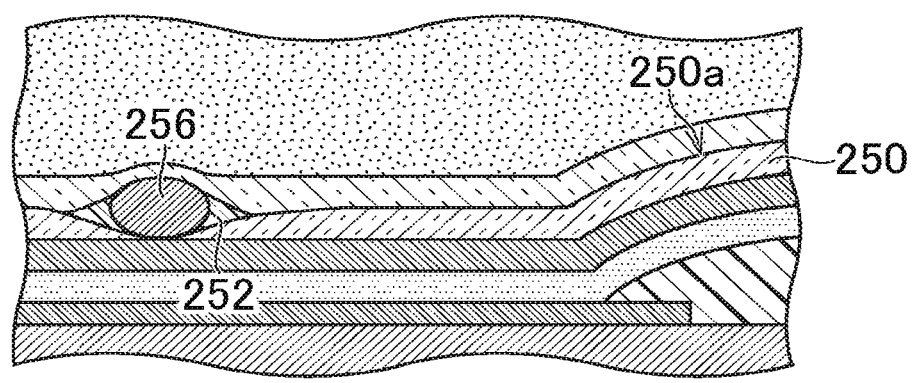
FIG. 6 is a diagram for explaining variation 2 of the method for manufacturing the display device according to an embodiment of the present invention.

FIG. 6 is a diagram for explaining variation 2 of the method for manufacturing the display device according to an embodiment of the present invention. This example is different from the variation 1 in that, in the process to ash an organic film 252, the organic film 252 is left so as to be protruded from an area immediately below a foreign substance 256 and not to reach a projection 250a of a first inorganic film 250. Other processes are the same as the processes described in the embodiment.

The display device is not limited to an organic electroluminescence display device, but may be a display device having a light emitting diode, such as a quantum-dot light emitting diode (QLED), in each pixel, or a liquid display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method for manufacturing a display device, comprising the steps of:
   forming a light-emitting element layer and an element layer including an anode and a cathode that sandwich the light-emitting element layer; and
   forming a sealing film so as to cover the entire element layer, wherein
   the step of forming the sealing film includes the steps of:
      forming a first inorganic film on the element layer;
      forming an organic film on the first inorganic film;
      ashing the organic film by using a foreign substance remaining on the organic film as a mask such that the organic film is left at least immediately below the mask and removed from at least a part of other areas; and
      forming a second inorganic film at least on the first inorganic film after ashing the organic film.

2. The method for manufacturing the display device according to claim 1, wherein
   the organic film is formed over the foreign substance in the step of forming the organic film, and is thicker at a part in contact with a circumference of the foreign substance than other parts of the organic film.

3. The method for manufacturing the display device according to claim 2, wherein
   the organic film is formed by vapor deposition in the step of forming the organic film.

4. The method for manufacturing the display device according to claim 2, wherein
   the element layer has an uneven shape on an upper surface,
   the first inorganic film is formed in the step of forming the first inorganic film so as to have a projection in accordance with the uneven shape, and
   the organic film is formed in the step of forming the organic film so as to be thinner at a part over the projection of the first inorganic film than at the circumference of the projection.

5. The method for manufacturing the display device according to claim 4, wherein
   the organic film is removed from over the projection in the step of asking the organic film so as to be left around the circumference of the projection of the first inorganic film.

6. The method for manufacturing the display device according to claim 4, wherein
   the anode and the cathode are a plurality of pixel electrodes and a common electrode, the pixel electrodes being disposed under the light-emitting element layer, the common electrode being disposed on the light-emitting element layer,
   the element layer further includes an insulating layer disposed on respective perimeters of the pixel electrodes, and
   the uneven shape is formed by surfaces of the pixel electrodes exposed from the insulating layer and the unevenness of the insulating layer.

\* \* \* \* \*